(12) United States Patent
Kim

(10) Patent No.: US 7,597,232 B2
(45) Date of Patent: Oct. 6, 2009

(54) APPARATUS FOR APPLYING CONDUCTIVE PASTE ONTO ELECTRONIC COMPONENT

(75) Inventor: Jae Taek Kim, Busan (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 19 days.

(21) Appl. No.: 11/513,219

(22) Filed: Aug. 31, 2006

(65) Prior Publication Data

US 2007/0057385 A1    Mar. 15, 2007

(30) Foreign Application Priority Data

Sep. 14, 2005    (KR) ...................... 10-2005-0085722

(51) Int. Cl.
*B23K 1/00* (2006.01)
*B23P 19/00* (2006.01)
(52) U.S. Cl. ........................... 228/6.2; 29/745; 29/746; 29/747; 225/45
(58) Field of Classification Search ................... 29/745, 29/746, 747; 228/6.2, 45
See application file for complete search history.

(56) References Cited

U.S. PATENT DOCUMENTS

2005/0089628 A1* 4/2005 Sanada et al. ................. 427/58

FOREIGN PATENT DOCUMENTS

| JP | 61-089653 | * | 5/1986 |
| JP | 02-205392 | | 8/1990 |
| JP | 02-301184 | | 12/1990 |
| JP | 04-234194 | | 8/1992 |
| JP | 05182879 A | * | 7/1993 |
| JP | 06-142576 | | 5/1994 |
| JP | 9-148723 | | 6/1997 |
| JP | 2000-107658 | | 4/2000 |
| JP | 2001-119133 | | 4/2001 |

OTHER PUBLICATIONS

Japanese Office Action issued in Japanese Patent Application No. 2006-184839, dated Jul. 14, 2009.

* cited by examiner

*Primary Examiner*—C. J Arbes
(74) *Attorney, Agent, or Firm*—McDermott Will & Emery LLP

(57) ABSTRACT

An apparatus and a method for applying a conductive paste, for forming electrodes, onto an electronic component, such as a micro chip device. The apparatus includes a first jig unit provided with paste holes, which are filled with the conductive paste; and a second jig unit being movable and provided with extruding pins, which are inserted into the paste holes of the first jig unit, for allowing the conductive paste to be applied onto the electronic component. The conductive paste is applied onto the electronic component, while the electronic component is loaded onto or unloaded from the first jig unit. The apparatus and the method allow the conductive paste for forming electrodes to be precisely applied onto the electronic component, easily adjust the amount of the applied conductive paste, prevent the spreading of the conductive paste or the incorrect application of the conductive paste, allow jig units, for applying the conductive paste onto the electronic component, to be used for a long time without replacement or washing, cause the reduction of the maintenance costs of the apparatus, and facilitate the formation of electrodes having various shapes on the electronic component.

6 Claims, 8 Drawing Sheets

(a)

(b)

(a)

(b)

(c)

APPARATUS FOR APPLYING CONDUCTIVE PASTE ONTO ELECTRONIC COMPONENT

RELATED APPLICATION

The present application is based on, and claims priority from, Korean Application Number 2005-85722 filed on Sep. 14, 2005, the disclosure of which is hereby incorporated by reference herein in its entirety.

BACKGROUND OF THE INVENTION

1. Field of the Invention

The present invention relates to an apparatus and a method for applying a conductive paste, for forming electrodes, onto an electronic component, especially a (micro) chip device, and more particularly to an apparatus and a method for applying a conductive paste onto an electronic component to allow the conductive paste to be precisely applied onto the electronic component and to precisely adjust the amount of the applied conductive paste.

2. Description of the Related Art

In a manufacturing process of an electronic component, for example, a micro chip device, such as a multi layer ceramic capacitor (MLCC), a method for forming external electrodes on the chip device by applying a conductive paste for the external electrodes onto the chip device and baking the conductive paste has been widely used.

However, in case that the conductive paste for forming external electrodes is applied onto the electronic component, such as the micro chip device, as the chip device has been recently miniaturized, the precision in applying the conductive paste onto the chip device becomes an issue.

For example, FIG. 1 illustrates a conventional chip device, and FIG. 2 illustrates a conventional highly dense chip device.

The highly dense chip device 110 of FIG. 2 is an array type, and thus a plurality of external electrodes 112 are formed on one chip device 110. That is, a plurality of chip units is integrated into one highly dense chip device 110.

In order to satisfy the mounting requirement of the chip device on a substrate, the amount of the applied conductive paste has been increased, the performance of the chip device has been improved, and further, the chip device has been developed to a small size. There is a clear distinction between the highly dense chip device 110 and the general chip device 100 of FIG. 1. For example, the highly dense chip device 110 of FIG. 2 comprises four circuits (not shown), and eight micro (external) electrodes 112, each of which is formed at both sides of the corresponding one of the circuits.

However, the general chip device 100 of FIG. 1, which is not integrated, comprises one circuit, and two (external) electrodes 102, each of which is formed at both sides of the circuit.

One of important problems to be solved for achieving the highly dense integration of the chip device is how to precisely form electrodes on the micro chip device, and the precise formation of the electrodes depends on the precision in applying a conductive paste onto the micro chip device.

For example, conventional conductive paste applying methods can be used to apply a conductive paste onto a micro chip device having a size of 2 mm×1.2 mm (hereinafter, referred to as a "2012 device"), which has been mainly used, so as to maintain the precision in applying the conductive paste. However, the above method cannot be substantially used to precisely apply a conductive paste onto a micro chip device having a smaller size of 1.6 mm×0.8 mm (hereinafter, referred to as a "1608 device") and a micro chip device having a smaller size of 1.0 mm×0.5 mm (hereinafter, referred to as a "1005 device"), thus generating problems in manufacturing micro chip devices.

FIGS. 3 and 4 illustrate conventional methods for applying a conductive paste onto a chip device.

FIG. 3 illustrates a method for applying (transferring) a conductive paste using wheels. In this method, a conductive paste is applied onto an electronic component using wheels 120 made of rubber or urethane.

As shown in FIG. 3, an electronic component, for example, a chip device 110, is mounted on a carrier tape (not shown), and the wheels 120, each of which is provided with grooves 124 filled with a conductive paste 122, continuously contact the chip device 110 while rotating. Thereby, the conductive paste 122 is applied onto the chip device 110 and it is possible to achieve mass production of the chip device 110.

Further, FIG. 4 illustrates a method for applying a conductive paste using a plate.

In this method of FIG. 4, a conductive paste 132 is applied onto the micro chip device 110 using a flat plate 130. The flat plate 130 is made of rubber or urethane, and is provided with grooves 134 filled with the conductive paste 132.

The above method apply (transfer) the conductive paste 132 simultaneously onto several hundreds of devices by increasing the size of the flat plate 130 and the size of a carrier plate for fixing the components, for example, a jig.

However, the above conventional applying methods generate several problems. For example, as shown in FIGS. 3 and 4, the wheels 120 and the flat plate 130, which are made of rubber or urethane, may be easily damaged by pressure applied thereto when the conductive paste is applied onto the electronic component. Thus, it is difficult to precisely apply the conductive paste onto the electronic component.

Since the wheels and the flat plate have a limitation in applying the conductive paste thereonto, the conventional applying methods cannot be used to manufacture micro chip devices having a size less than that of the 1608 device.

The amount of the applied conductive paste is limited due to the surface tension of rubber or urethane. For example, only approximately 50% of the total amount of the conductive paste filling the grooves of the wheels or the flat plate is substantially applied onto the chip device, thus causing problems, such as cleaning of remaining paste, and in a serious case, the replacement of the wheels or the flat plate with a new one.

The wheels and the flat plate, which are made of rubber or urethane, are easily abraded by the pressure, thus having a shortened life span.

In order to solve the above problems, Japanese Patent Laid-open Publication No. 1997-148723 discloses a solder ball transfer jig. The solder ball transfer jig comprises a transfer mask and a plate. The transfer mask is provided with discs each having a recess on its top surface is carrying a solder ball to be supplied to each of pads of a substrate, and holes each having an elastic member inserted thereinto. The plate is provided with projections inserted into the holes of the transfer mask for pushing the solder balls against the pads of the substrate, and moves below the transfer mask.

Since a conductive paste does not fill the transfer mask, the above transfer jig cannot use the applying method, in which the transfer jig is filled with the conductive paste. Further, the transfer jig uses the discs and the elastic members, which are separately prepared, thus having a complicated structure.

SUMMARY OF THE INVENTION

Therefore, the present invention has been made in view of the above problems, and it is an object of the present invention to provide an apparatus and a method for applying a conductive paste onto an electronic component to allow the conductive paste, for forming electrodes, to be precisely applied onto the electronic component, to precisely adjust the amount of the applied conductive paste, and to prevent the spreading of the conductive paste or the incorrect application of the conductive paste when the conductive paste forms the external electrodes, thus improving the quality of the external electrodes formed by applying the conductive paste.

It is another object of the present invention to provide an apparatus and a method for applying a conductive paste onto an electronic component to allow jig units, for applying the conductive paste, to have a semi-permanent life span and thus be used for a long time without replacement or washing, to reduce the maintenance costs of the apparatus, and to facilitate the formation of electrodes having various shapes.

In accordance with one aspect of the present invention, the above and other objects can be accomplished by the provision of an apparatus for applying a conductive paste to an electronic component comprising a first jig unit provided with paste holes, which are filled with the conductive paste; and a second jig unit being movable and provided with extruding pins, which are inserted into the paste holes of the first jig unit, for allowing the conductive paste to be applied onto the electronic component.

Preferably, an interval between one surface of the first jig unit contacting the electronic component and the upper surface of each of the extruding pins of the second jig unit inserted into the paste holes is varied according to the amount of the conductive paste applied onto the electronic component.

Further, preferably, the electronic component has a spherical shape, the first jig unit includes a spherical plane for loading the spherical electronic component, and the paste holes are straight or bent according to regions of the spherical plane.

Here, the electronic component is loaded onto or unloaded from the first jig unit under the condition that the electronic component is disposed above the upper surface or below the lower surface of the first jig unit in a horizontally laid state, or is disposed by the side of the first jig unit in a vertically erected state.

The apparatus further comprises a third jig unit provided with filling portions, which are inserted into the paste holes of the first jig unit, allow the extruding pins of the second jig unit to be inserted thereinto, and are filled with the conductive paste.

The jig units are made of one selected from the group consisting of metals, nonferrous metals, and high-strength plastics.

In accordance with another aspect of the present invention, there is provided a method for applying a conductive paste onto an electronic component comprising filling paste holes of a first jig unit with the conductive paste; loading the electronic component onto the first jig unit; moving extruding pins of a second jig unit, which are inserted into the paste holes of the first jig unit, upward to apply the conductive paste onto the electronic component; and unloading the electronic component, with the conductive paste applied thereonto, from the first jig unit.

The electronic component is loaded onto or unloaded from the first jig unit under the condition that the electronic component is disposed above the upper surface or below the lower surface of the first jig unit in a horizontally laid state, or is disposed by the side of the first jig unit in a vertically erected state.

The paste holes of the first jig unit and the extruding pins of the second jig unit have the same shape, and form electrodes having various shapes, each of which is one selected from the group consisting of a circle, a rectangle, a polygon, a star, and a bar, on the electronic component.

BRIEF DESCRIPTION OF THE DRAWINGS

The above and other objects, features and other advantages of the present invention will be more clearly understood from the following detailed description taken in conjunction with the accompanying drawings, in which:

FIG. 6a is a view of the apparatus in a state in which a component is disposed below the lower surface of the apparatus; and FIG. 6b is a view of the apparatus in a state in which a component is disposed above the upper surface of the apparatus;

FIG. 7a is a view of the apparatus in a state in which the apparatus is disposed at both sides of a component; and FIG. 7b is a view of the apparatus in a state in which the apparatus is disposed at one side of a component;

FIG. 9a is a plane view illustrating the state of a spherical component, onto which a conductive paste is applied; and FIG. 9b is a schematic view illustrating the apparatus corresponding to the spherical component;

FIG. 10a is a schematic view illustrating electrodes having a circular shape;

FIG. 10b is a schematic view illustrating electrodes having circular and star shapes; and FIG. 10c is a schematic view illustrating electrodes having various shapes.

DESCRIPTION OF THE PREFERRED EMBODIMENTS

Now, preferred embodiments of the present invention will be described in detail with reference to the annexed drawings.

Figure 5:
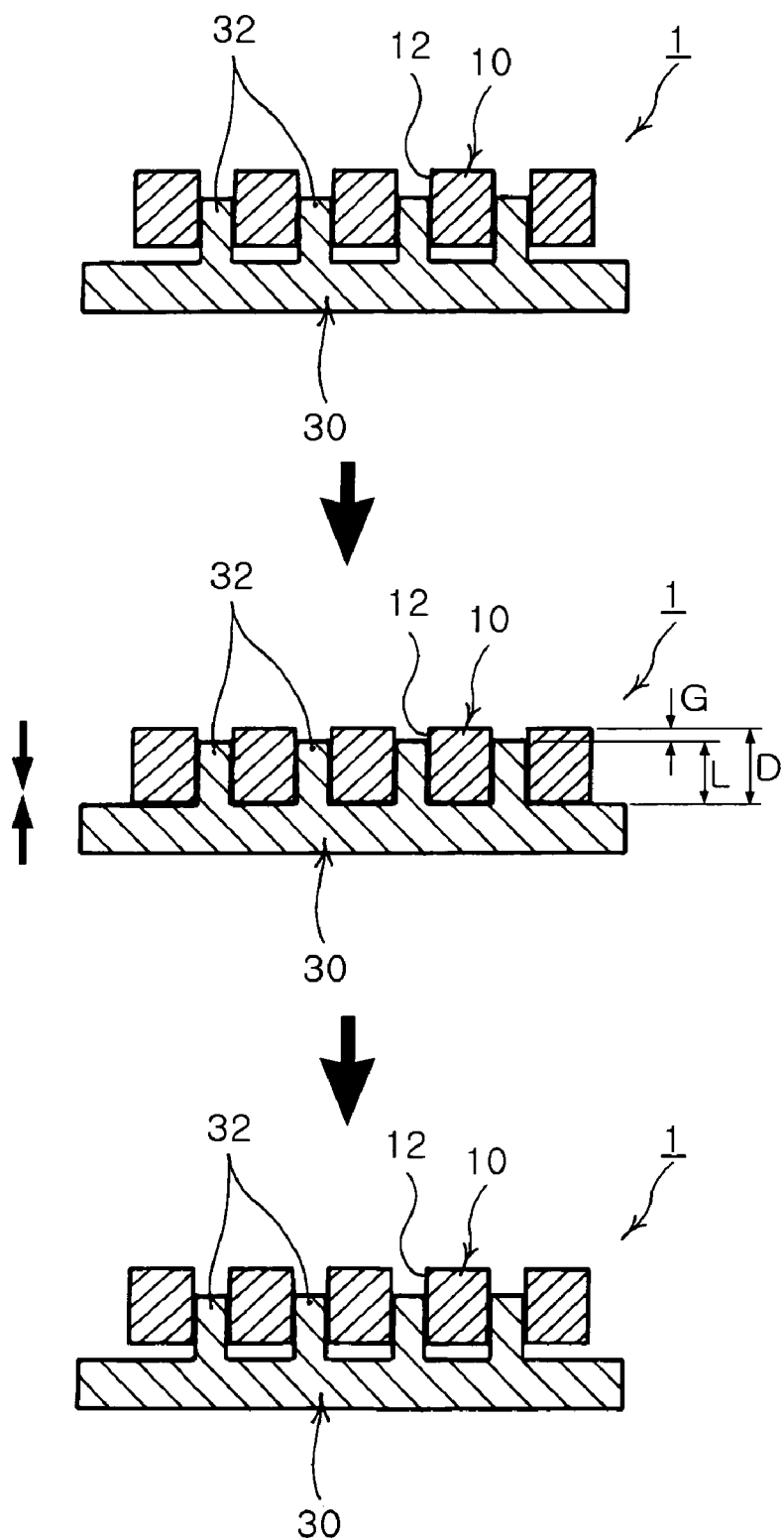
FIG. 5 is schematic view illustrating an apparatus for applying a conductive paste onto an electronic component in accordance with one embodiment of the present invention.

First, FIG. 5 illustrates an apparatus 1 for applying a conductive paste onto an electronic component in accordance with one embodiment of the present invention.

As shown in FIG. 5, the apparatus 1 of the present invention comprises a first jig unit 10 and a second jig unit 30.

Figure 8:
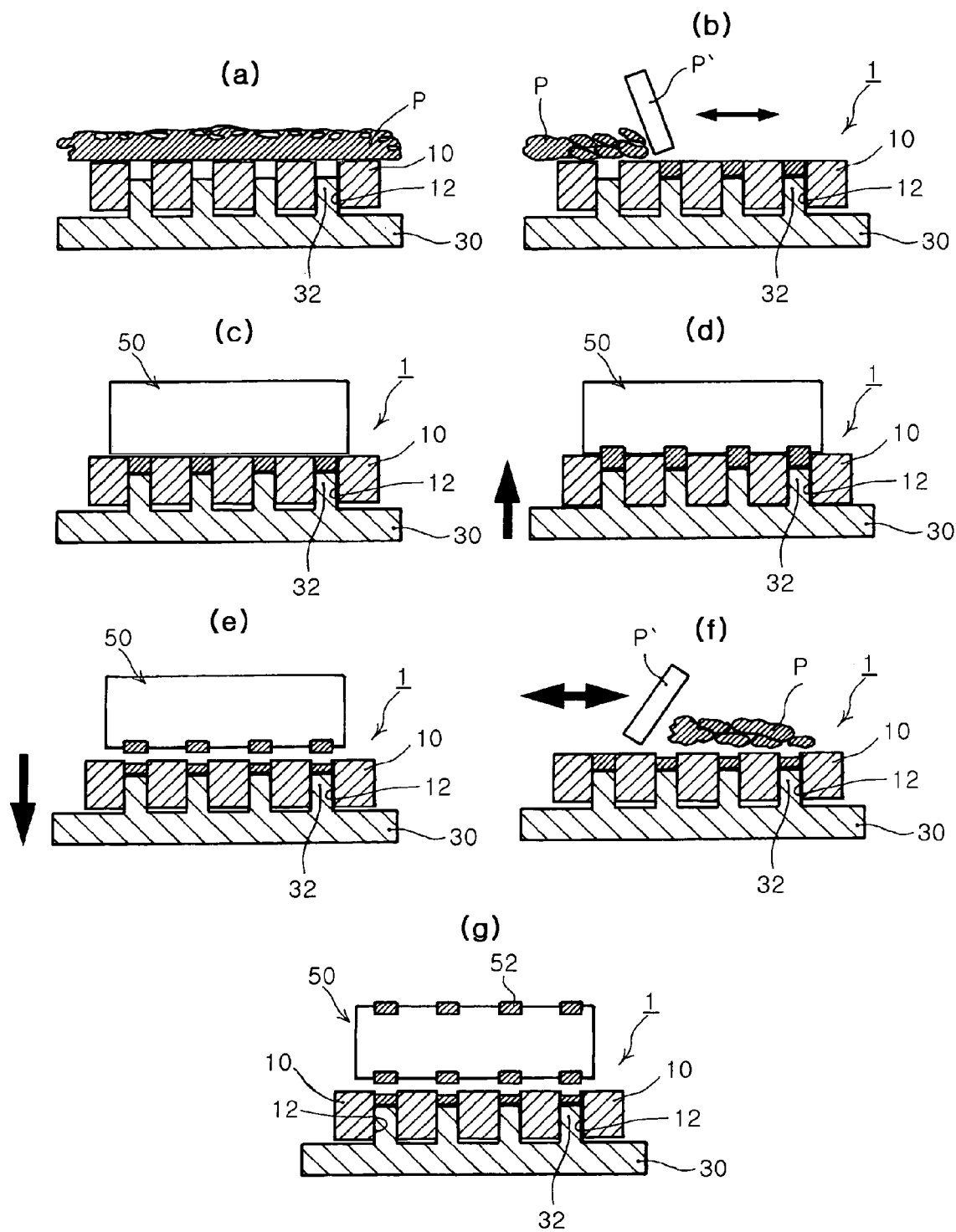
FIGS. 8a to 8g are sectional views for illustrating a method for applying a conductive paste onto an electronic component using the apparatus of the present invention.

The first jig unit 10 is provided with paste holes 12, which are filled with a conductive paste (P of FIG. 8) and allow extruding pins 32 of the second jig unit 30 to be passed therethrough.

Figure 6:
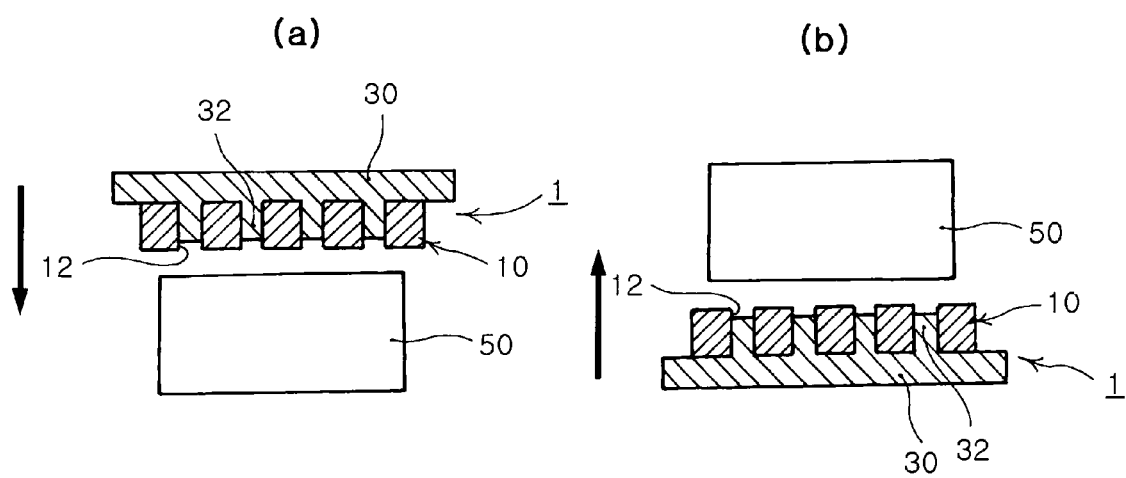
FIGS. 6a and 6b are schematic views illustrating the vertical disposition of the apparatus of the present invention and a component, and more specifically.

Further, the second jig unit 30 is provided with the extruding pins 32, which are inserted into the paste holes 12 of the first jig unit 10, thus applying the conductive paste (P) onto an electronic component (50 of FIG. 6).

Accordingly, as the electronic component 50, i.e., a micro chip device, which is adjacent to the first jig unit 10, is loaded onto the first jig unit 10 or unloaded from the first jig unit 10, and the second jig unit 30 moves, a proper amount of the conductive paste (P) is applied onto the electronic component 50. Here, the applied conductive paste (P) forms external electrodes of the electronic component 50.

In the apparatus 1, as shown in FIG. 5, the first jig unit 10 is a fixed unit, and the second jig unit 30 is a movable unit. The number of the paste holes 12 of the first jig unit 10 or the extruding pins 32 of the second jig unit 30 is equal to that of the electrodes (52 of FIG. 8) of the electronic component 50.

Although not shown in the drawings, the first and second jig units 10 and 30 substantially include a plurality of the paste holes 12 and a plurality of the extruding pins 32. Accordingly, it is possible to apply the conductive paste (P) simultaneously onto a plurality of electronic components using a single first jig unit 10 and a single second jig unit 30 only by adjusting the loading positions of the electronic components onto the first jig unit 10.

As shown in FIG. 5, an interval (G) between a surface of the first jig unit 10 contacting the electronic component 50 and the tip of each of the extruding pins 32 of the second jig unit 30 inserted into the paste holes 12 is varied according to the amount of the conductive paste (P) applied onto the electronic component 50.

Accordingly, the interval (G), which corresponds to a difference between the length (L) of the extruding pins 32 of the second jig unit 20 and the depth (D) of the paste holes 12 of the first jig unit 10, determines the amount of the conductive paste (P), which is substantially applied onto the electronic component 50.

The amount of the conductive paste (P) is increased or decreased by loading states of the electronic component 50, i.e., a contact-type loading state, in which the electronic component 50 contacts the first jig unit 10, and a noncontact-type loading state, in which the electronic component 50 does not contact the first jig unit 10.

That is, the amount of the conductive paste (P) is adjusted by controlling the loading state of the electronic component 50 in the same apparatus. This does not require the manufacture of various jig units, thus reducing the production costs of the apparatus.

Although not shown in the drawings, the movement degree of the second jig unit 30 is precisely adjusted using a servomotor.

Figure 1:
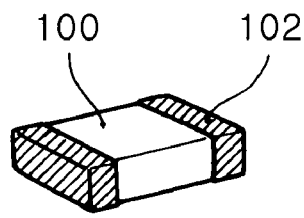
FIG. 1 is a perspective view of a conventional chip device.
Figure 2:
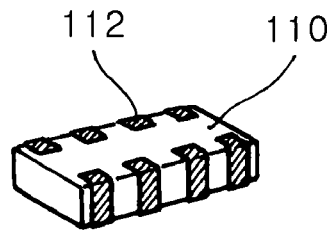
FIG. 2 is a perspective view of a conventional highly dense chip device.
Figure 3:
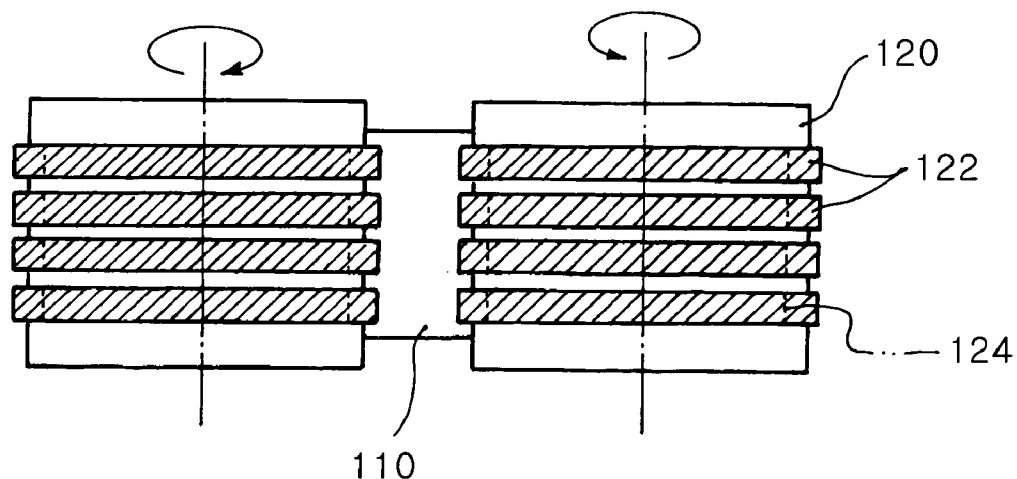
FIG. 3 is a schematic view illustrating a conventional method for applying a conductive paste onto a chip device.
Figure 4:
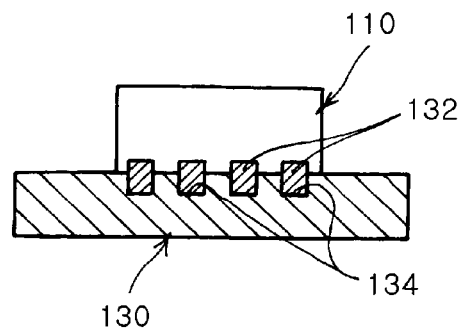
FIG. 4 is a schematic view illustrating another conventional method for applying a conductive paste onto a chip device.

The first and second jig units 10 and 30 of the apparatus 1 of the present invention, as shown in FIG. 5, are made of one selected from the group consisting of metals, nonferrous metals, and high-strength (engineering) plastics. Compared to one conventional paste applying method using wheels or a flat plate made of urethane or rubber, as shown in FIG. 2 or 3, the apparatus 1 of the present invention has an elongated life span, increases the precision in applying the conductive paste, and is scarcely deformed when it is used.

Figure 11:
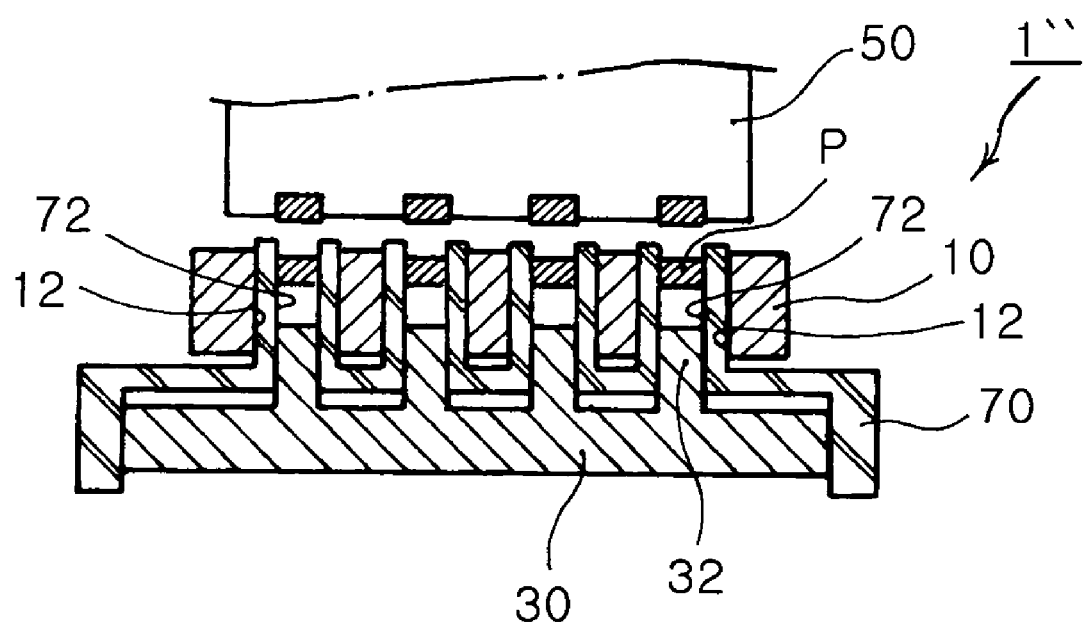
FIG. 11 is a sectional view of an apparatus for applying a conductive paste onto an electronic component, which employs a multi-stage jig structure including at least three jig units, in another modified embodiment of the present invention.

Further, a third jig unit 70, which will be described later with reference to FIG. 11, is made of the same material.

A tolerance between the paste holes 12 of the first jig unit 10 and the extruding pins 32 of the second jig unit 20 allows the extruding pins 32 to move smoothly.

FIGS. 6a and 6b and FIGS. 7a and 7b illustrate various dispositions of the apparatus 1 of the present invention and the electronic component 50.

As shown in FIGS. 6a and 6b, the electronic component 50 is loaded onto or unloaded from the first jig unit 10 under the condition that the electronic component 50 is disposed above the upper surface or below the lower surface of the first jig unit 10 of the apparatus 1, thus having the conductive paste (P) applied thereto.

Figure 7:
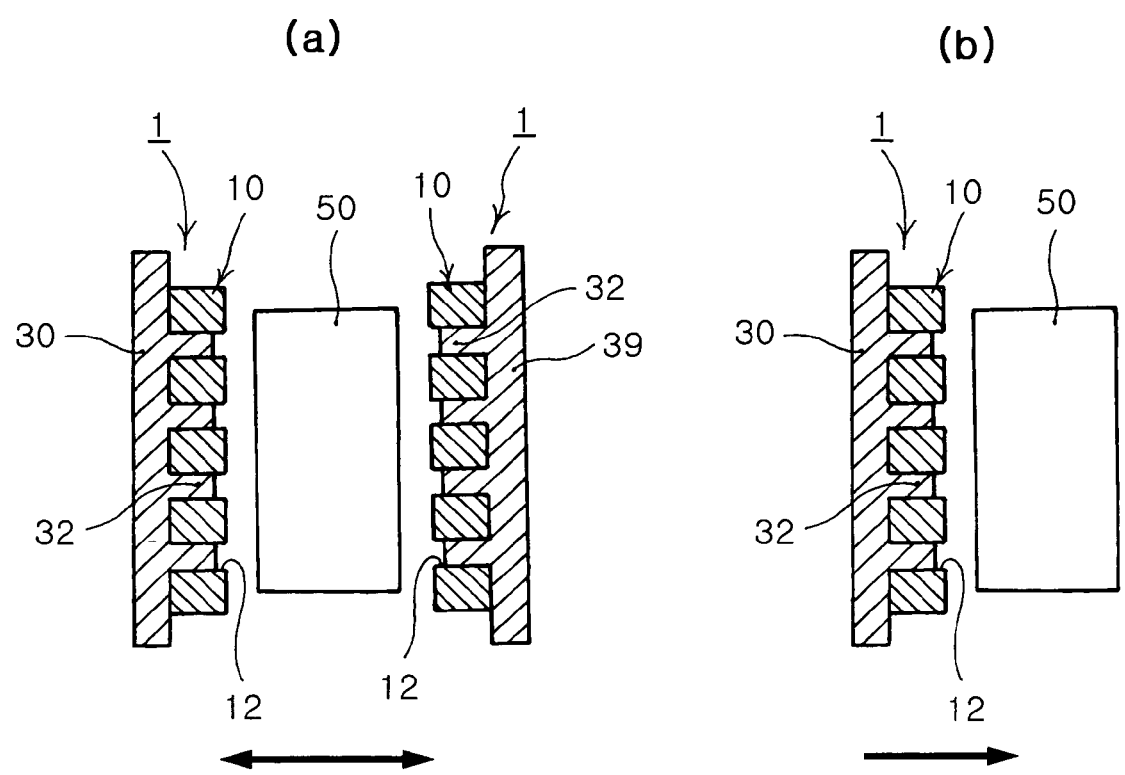
FIGS. 7a and 7b are schematic views illustrating the horizontal disposition of the apparatus of the present invention and a component, and more specifically.

Further, as shown in FIGS. 7a and 7b, the electronic component 50 may be horizontally disposed. For example, as shown in FIG. 7a, one apparatus 1 is disposed at both sides of the electronic component 50, so that the conductive paste (P) can be applied simultaneously onto both surfaces of the electronic component 50, or, as shown in FIG. 7b, one apparatus 1 is disposed at one side of the electronic component 50, so that the conductive paste (P) can be applied onto one surface of the electronic component 50.

Accordingly, the apparatus 1 of the present invention can be modified into various types according to usage conditions of the apparatus 1.

Next, FIGS. 8a to 8g illustrate a method for applying a conductive paste onto an electronic component using the apparatus 1 of the present invention by steps.

That is, as shown in FIG. 8a, the conductive paste (P) is applied onto the upper surface of the first jig unit 10, provided with the paste holes 12, of the apparatus 1 of the present invention.

Thereafter, as shown in FIG. 8b, the conductive paste (P) densely fills the paste holes 12 of the first jig unit 10 using a transfer tool, such as a push rod (P').

Here, when the conductive paste (P) does not densely fill the paste holes 12 but fine pores exist in the paste holes 12, imbalance between the expected amount of the applied conductive paste (P) and the real amount of the applied conductive paste (P) occurs. Accordingly, the conductive paste (P) must densely fill the paste holes 12.

Thereafter, as shown in FIG. 8c, the electronic component 50 is loaded onto the first jig unit 10 in the contact loading state, in which the electronic component 50 contacts the upper surface of the first jig unit 10, or in the noncontact loading state, in which the electronic component does not contact the upper surface of the first jig unit 10.

The contact or noncontact loading state is determined in advance by the amount of the applied conductive paste (P).

Thereafter, as shown in FIG. 8d, the extruding pins 32 of the second jig unit 30, which are inserted into the paste holes 12 of the first jig unit 10, move upward, thus allowing the conductive paste (P), having a thickness corresponding to the remaining interval (G) between the extruding pins 32 and the paste holes 12, to be applied onto one surface of the electronic component 50 loaded onto the first jig unit 10.

Thereafter, as shown in FIG. 8e, the electronic component 50, which is provided with electrodes 52 formed by applying the conductive paste (P) onto one surface thereof, is loaded from the first jig unit 10. Then, as shown in FIGS. 8f and 8g, the conductive paste (P) is applied onto the other surface of the electronic component 50 through the above-described steps in the same order. Thereby, the formation of the electrodes 52 on the electronic component 50 is completed.

Figure 9:
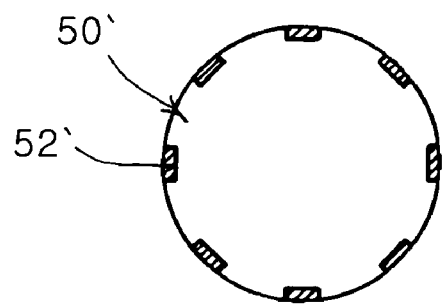
FIGS. 9a and 9b are views illustrating an apparatus for applying a conductive paste onto an electronic component in accordance with a modified embodiment of the present invention, and more specifically.
Figure 9:
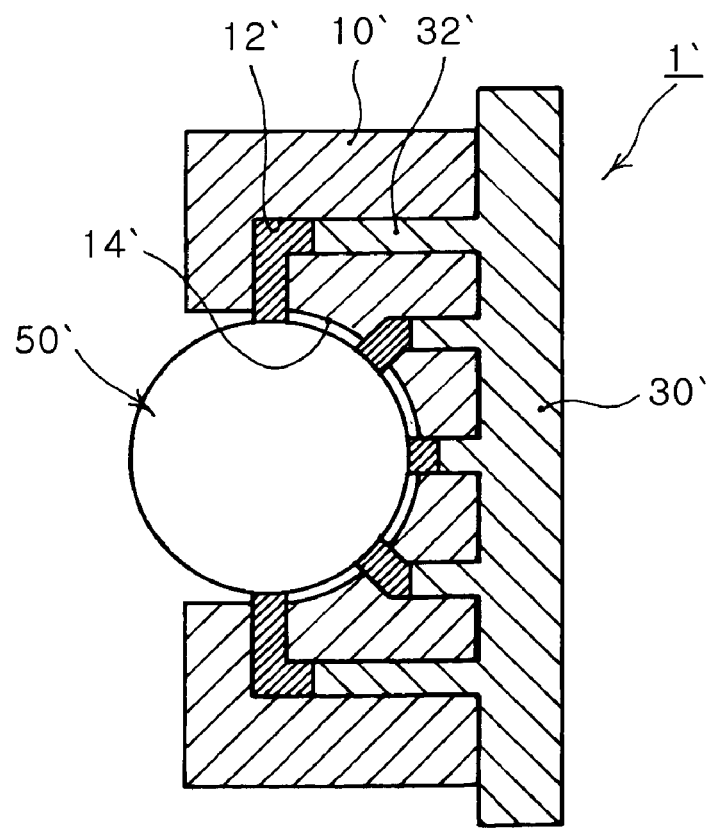

FIGS. 9a and 9b illustrate an apparatus 1' for applying a conductive paste onto an electronic component in accordance with a modified embodiment of the present invention.

That is, as shown in FIG. 9a, in case that an electronic component 50' has a spherical shape, a first jig unit 10' includes a spherical plane 14' for loading the spherical electronic component 50', and paste holes 12' having different shapes according to regions of the spherical plane 14'. For example, as shown in FIG. 9b, the paste hole 12' at the center of the spherical plane 14' is straight, and other paste holes 12' are bent such that the bending angles of the paste holes 12' are decreased from the central region to the edge region of the spherical plane 14'.

Further, the lengths of extruding pins 32' of a second jig unit 30' are increased from the central region to the edge region of the second jig unit 30', corresponding to the shapes of the paste holes 12' of the first jig unit 10'.

Accordingly, the apparatus 1' using the first and second jig units 10' and 30' easily and precisely applies the conductive paste onto the electronic component 50' having a spherical shape.

Figure 10:
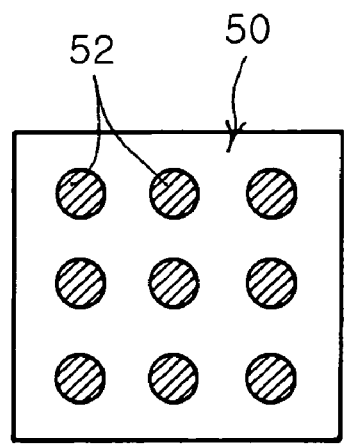
FIGS. 10a to 10c are views illustrating various shapes of electrodes formed using the apparatus of the present invention, and more specifically.
Figure 10:
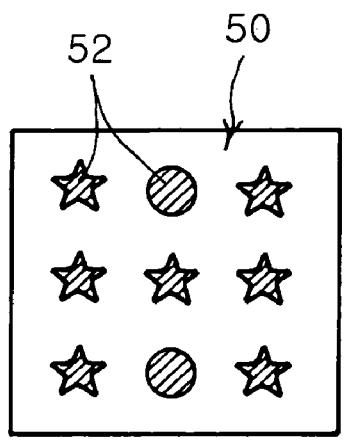
Figure 10:
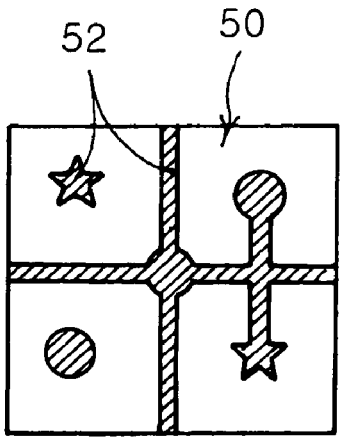

FIGS. 10a to 10c are views illustrating various shapes of electrodes formed using the apparatus 1 of the present invention.

As shown in FIGS. 10a to 10c, the paste holes 12 of the first jig unit 10 and the extruding pins 32 of the second jig unit 30 have the same shape, and form electrodes 52 having various shapes, such as a circle, a rectangle, a polygon, a star, and a bar, on the electronic component 50.

Thereby, electrodes having various shapes can be formed on the electronic component only by unifying the shapes of the paste holes 12 of the first jig unit 10 and the shapes of the extruding pins 32 of the second jig unit 30 of the apparatus 1.

Accordingly, the various shapes of the electrodes formed on the electronic component allow the mounting design of the electronic component on a substrate to be diversified.

FIG. 11 illustrates an apparatus 1" for applying a conductive paste onto an electronic component in accordance with another modified embodiment of the present invention.

That is, as shown in FIG. 11, the apparatus 1" having a multi-stage jig structure further comprises a third jig unit 70 provided with filling portions 72, which are inserted into the paste holes 12 of the first jig unit 10. The extruding pins 32 of the second jig unit 30 are inserted into the filling portions 72 of the third jig unit 70, and then the filling portions 72 of the third jig unit 70 are filled with the conductive paste (P).

Since the filling portions 72 of the third jig unit 70 are substantially filled with the conductive paste (P), the apparatus 1" employing the third jig unit 70 is advantageous in that the filling portions 72 of the third jig unit 70 are conveniently cleaned. Accordingly, the apparatus 1" prevents problems generated due to the remaining conductive paste, compared to the apparatus 1 as shown in FIG. 5.

Further, the apparatus 1" using the third jig unit 70 increases the precision in applying the conductive paste onto the electronic component 50.

Accordingly, the apparatus 1, 1', or 1" for applying a conductive paste onto an electronic component in accordance with the present invention allows a conductive paste, for forming electrodes, to be effectively applied onto an electronic component, for example, a micro chip device, and improves the precision in applying the conductive paste. Thus, the apparatus 1, 1', or 1" is easily applicable to the micro chip device, and facilitates the precise application of the conductive paste onto the micro chip device.

As apparent from the above description, the present invention provides an apparatus and a method for applying a conductive paste onto an electronic component, which allows the conductive paste, for forming electrodes, to be precisely applied onto a micro chip device, easily adjusts the amount of the applied conductive paste, and prevents the spreading of the conductive paste or the incorrect application of the conductive paste, thus improving the quality of the external electrodes formed by applying the conductive paste.

Further, since jig units for applying the conductive paste have a semi-permanent life span and are thus used for a long period of time without replacement or washing, it is possible to reduce the maintenance costs of the apparatus.

Particularly, it is possible to easily form various-shaped electrodes on the electronic component.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for applying a conductive paste onto an electronic component comprising:
   a first jig unit provided with paste holes, which are filled with the conductive paste; and
   a second jig unit being movable and provided with extruding pins, which are inserted into the paste holes of the first jig unit, for allowing the conductive paste to be applied onto the electronic component,
   wherein an interval between one surface of the first jig unit contacting the electronic component and the upper surface of each of the extruding pins of the second jig unit inserted into the paste holes is varied according to the amount of the conductive paste applied onto the electronic component.

2. The apparatus according to claim 1, wherein: the electronic component has a spherical shape;
   the first jig unit includes a spherical plane for loading the spherical electronic component; and
   the paste holes are straight or bent according to regions of the spherical plane.

3. The apparatus according to claim 1, wherein the electronic component is loaded onto or unloaded from the first jig unit under the condition that the electronic component is disposed above the upper surface or below the lower surface of the first jig unit in a horizontally laid state, or is disposed by the side of the first jig unit in a vertically erected state.

4. The apparatus according to claim 1, wherein the jig units are made of one selected from the group consisting of metals, nonferrous metals, and high-strength plastics.

5. The apparatus according to claim 1, further comprising a third jig unit provided with filling portions, which are inserted into the paste holes of the first jig unit, allow the extruding pins of the second jig unit to be inserted thereinto, and are filled with the conductive paste.

6. The apparatus according to claim 5, wherein the jig units are made of one selected from the group consisting of metals, nonferrous metals, and high-strength plastics.

\* \* \* \* \*